US010015846B2

(12) United States Patent
Tang et al.

(10) Patent No.: US 10,015,846 B2
(45) Date of Patent: Jul. 3, 2018

(54) SEMICONDUCTOR MICROWAVE OVEN AND MICROWAVE FEEDING STRUCTURE THEREOF

(75) Inventors: Xiangwei Tang, Guangdong (CN); Junhui Ou, Guangdong (CN); Chunhua Liang, Guangdong (CN)

(73) Assignees: Guangdong Midea Kitchen Appliances MFGT. Co. Ltd., Foshan, Guangdong (CN); Midea Group Co. Ltd., Foshan, Guangdong (CN)

( * ) Notice: Subject to any disclaimer, the term of this patent is extended or adjusted under 35 U.S.C. 154(b) by 289 days.

(21) Appl. No.: 14/355,270

(22) PCT Filed: Sep. 14, 2012

(86) PCT No.: PCT/CN2012/081383

§ 371 (c)(1),
(2), (4) Date: May 27, 2014

(87) PCT Pub. No.: WO2013/063985

PCT Pub. Date: May 10, 2013

(65) Prior Publication Data

US 2014/0305933 A1 Oct. 16, 2014

(30) Foreign Application Priority Data

Oct. 31, 2011 (CN) .......................... 2011 1 0339203

(51) Int. Cl.
*H05B 6/70* (2006.01)
*H05B 6/64* (2006.01)
(Continued)

(52) U.S. Cl.
CPC ........... *H05B 6/705* (2013.01); *H05B 6/6408* (2013.01); *H05B 6/686* (2013.01); *H05B 6/702* (2013.01); *H05B 6/707* (2013.01); *H05B 6/80* (2013.01)

(58) Field of Classification Search
CPC .......... H05B 6/702; H05B 6/705; H05B 6/80; H05B 6/6408; H05B 6/707; H05B 6/686; F24C 7/02
(Continued)

(56) References Cited

U.S. PATENT DOCUMENTS 4,336,434 A * 6/1982 Miller .................... H05B 6/704 219/747
4,999,469 A 3/1991 Dudley et al.
(Continued)

FOREIGN PATENT DOCUMENTS

CN 1764332 4/2006
CN 101979923 2/2011
(Continued)

OTHER PUBLICATIONS

Japanese International Search Report corresponding to CN2012081382 (14 pages).
(Continued)

*Primary Examiner* — Quang Van
(74) *Attorney, Agent, or Firm* — Maginot, Moore & Beck, LLP

(57) ABSTRACT

A semiconductor microwave oven and a microwave feeding structure thereof are provided. The microwave feeding structure of the semiconductor microwave oven includes: a chamber body having a door; a semiconductor power source configured to generate a microwave; and a microwave feeding assembly connected between the semiconductor power source and the chamber body, and configured to feed the microwave generated by the semiconductor power source into the chamber body and to convert a first microwave mode output by the semiconductor power source into a second microwave mode adaptive to microwave heating.

9 Claims, 4 Drawing Sheets

(51) Int. Cl.

| | |
|---|---|
| ***H01J 37/32*** | (2006.01) |
| ***H05B 6/80*** | (2006.01) |
| ***H05B 6/68*** | (2006.01) |

(58) Field of Classification Search

USPC ............... 219/696, 697, 695, 690, 761, 747, 219/121.43; 588/249, 259; 422/305, 307

See application file for complete search history.

(56) References Cited

U.S. PATENT DOCUMENTS

| | | | | |
|---|---|---|---|---|
| 5,874,706 | A | 2/1999 | Ishii et al. | |
| 6,087,614 | A * | 7/2000 | Ishizuka ........... | H01J 37/32192 118/723 MR |
| 2009/0206071 | A1* | 8/2009 | Mori .................... | H05B 6/6408 219/690 |
| 2010/0243645 | A1 | 9/2010 | Ishizaki et al. | |

FOREIGN PATENT DOCUMENTS

| | | | | | |
|---|---|---|---|---|---|
| CN | 102062424 | | | 5/2011 | |
| CN | 102067723 | | | 5/2011 | |
| CN | 102374557 | | | 3/2012 | |
| CN | 202303515 | | | 7/2012 | |
| EP | 2 205 043 | A1 | | 7/2010 | |
| EP | 2 306 785 | A1 | | 4/2011 | |
| GB | 2127260 | | | 4/1984 | |
| JP | WO 8403008 | A1 | * | 8/1984 | ............. H01Q 1/247 |
| JP | 05152811 | A | * | 6/1993 | |
| JP | 2004207011 | A | | 7/2004 | |
| JP | 200280786 | A | | 10/2007 | |
| JP | 2010272268 | A | | 12/2010 | |

OTHER PUBLICATIONS

European Search Report corresponding to European patent No. 128450459.9, dated Jun. 15, 2015 (5 pages).

* cited by examiner

SEMICONDUCTOR MICROWAVE OVEN AND MICROWAVE FEEDING STRUCTURE THEREOF

CROSS-REFERENCE TO RELATED APPLICATION

This application is a national stage application of PCT/CN2012/081383, which claims priority to and benefits of Chinese Patent Application Serial No. 201110339203.X, filed with the State Intellectual Property Office of P. R. China on Oct. 31, 2011, the entire contents of which is incorporated herein by reference.

FIELD

Embodiments of the present invention relate to a semiconductor microwave oven and a microwave feeding structure thereof.

BACKGROUND

A magnetron microwave oven in the related art includes a magnetron, a transformer, a high-voltage capacitor, a high-voltage diode, a chamber body, a door and a control component. As shown in FIG. 1, a microwave generated by a magnetron tube 11' is fed into a chamber body 13' of a microwave oven via a rectangular wave guide 12', so as to heat food in the chamber body 13'.

A semiconductor microwave technology has been widely applied. A frequency band of the semiconductor microwave technology applied in the communication field is different from that applied in microwave heating field. The microwave output by a semiconductor power source has a mode of TE11 and an impedance of 50Ω, and a microwave mode adaptive to microwave heating is TE10. In order to apply the semiconductor microwave technology to the microwave oven, there is a need for a microwave feeding structure for feeding a microwave output of a semiconductor power source into a chamber body of the microwave oven.

SUMMARY

The present invention seeks to solve at least one of the problems existing in the related art to at least some extent.

An object of the present invention is to provide a microwave feeding structure for a semiconductor microwave oven, which is simple in structure, flexible to operate, and wide in application range.

Another object of the present invention is to provide a semiconductor microwave oven having the abovementioned microwave feeding structure.

A microwave feeding structure for a semiconductor microwave oven according to embodiments of a first aspect of the present invention includes: a chamber body having a door; a semiconductor power source configured to generate a microwave; and a microwave feeding assembly connected between the semiconductor power source and the chamber body, and configured to feed the microwave generated by the semiconductor power source into the chamber body and to convert a first microwave mode output by the semiconductor power source into a second microwave mode adaptive to microwave heating.

The microwave feeding structure for the semiconductor microwave oven according to embodiments of the present invention may feed the microwave generated by the semiconductor power source into the chamber body, and convert a microwave of a mode of TE11 output by the semiconductor power source into a microwave of a mode of TE10 adaptive to microwave heating. Moreover, the microwave feeding structure is simple and reasonable in structure, flexible to operate, and wide in application range.

In some embodiments, the semiconductor power source includes: a semiconductor power plate connected with the microwave feeding assembly; a shield disposed above the semiconductor power plate; and a radiator attached on a bottom surface of the semiconductor power plate.

The microwave feeding structure according to embodiments of the present invention further includes a rectangular wave guide connected with the chamber body, wherein the microwave feeding assembly is connected between the semiconductor power source and the rectangular wave guide.

In some embodiments, the microwave feeding assembly includes: a mounting tube; a ceramic ring connected with the mounting tube; a tube case connected with the ceramic ring; and an antenna defining a first end connected with the semiconductor power source and a second end extended through the tube case, the ceramic ring and the mounting tube sequentially into the rectangular wave guide.

In some embodiments, an antenna cap is fitted over an end of the mounting tube adjacent to the rectangular wave guide, and the microwave feeding assembly further includes: a bottom plate mounted on the rectangular wave guide, the ceramic ring being mounted on one side of the bottom plate, and the tube case being mounted on the other side of the bottom plate; a first fixing ring mounted on the semiconductor power source; and a second fixing ring fitted over the tube case and connected with the bottom plate and the first fixing ring.

In some embodiments, the microwave feeding assembly includes: a bottom plate mounted on the rectangular wave guide; a first fixing ring connected between the bottom plate and the semiconductor power source; and a probe passing through the bottom plate and the first fixing ring, and defining a first end connected with the semiconductor power source and a second end extended into the rectangular wave guide.

In some embodiments, the first end of the probe is connected with a micro-strip line of the semiconductor power source directly or via a coaxial transmission cable.

In some embodiments, the microwave feeding assembly includes an antenna defining a first end connected with the semiconductor power source via a coaxial transmission cable and a second end extended into the chamber body.

In some embodiments, a ceramic plate is disposed in the chamber body and divides an interior of the chamber body into a first chamber and a second chamber, the second end of the antenna being extended into the second chamber.

A semiconductor microwave oven according to embodiments of a second aspect of the present invention includes: a chamber body having a door; a semiconductor power source configured to generate a microwave; a microwave feeding assembly connected between the semiconductor power source and the chamber body, and configured to feed the microwave generated by the semiconductor power source into the chamber body and to convert a first microwave mode output by the semiconductor power source into a second microwave mode adaptive to microwave heating; and a power supply connected with the semiconductor power source.

With the semiconductor microwave oven according to embodiments of the present invention, the microwave is generated by the semiconductor power source, and a microwave of a mode of TE11 output by the semiconductor power source is converted into a microwave of a mode of TE10 adaptive to microwave heating by means of the microwave feeding assembly, such that the semiconductor microwave oven is high in efficiency, simple in structure, low in cost and light in weight, and generates a large power density per unit volume.

In some embodiments, the semiconductor power source includes: a semiconductor power plate connected with the microwave feeding assembly; a shield disposed above the semiconductor power plate; and a radiator attached on a bottom surface of the semiconductor power plate.

The semiconductor microwave oven according to according to embodiments of the present invention further includes a rectangular wave guide connected with the chamber body, wherein the microwave feeding assembly is connected between the semiconductor power source and the rectangular wave guide.

In some embodiments, the microwave feeding assembly includes: a mounting tube; a ceramic ring connected with the mounting tube; a tube case connected with the ceramic ring; and an antenna defining a first end connected with the semiconductor power source and a second end extended through the tube case, the ceramic ring and the mounting tube sequentially into the rectangular wave guide.

In some embodiments, an antenna cap is fitted over an end of the mounting tube adjacent to the rectangular wave guide, and the microwave feeding assembly further includes: a bottom plate mounted on the rectangular wave guide, the ceramic ring being mounted on one side of the bottom plate, and the tube case being mounted on the other side of the bottom plate; a first fixing ring mounted on the semiconductor power source; and a second fixing ring fitted over the tube case and connected with the bottom plate and the first fixing ring.

In some embodiments, the microwave feeding assembly includes: a bottom plate mounted on the rectangular wave guide; a first fixing ring connected between the bottom plate and the semiconductor power source; and a probe passing through the bottom plate and the first fixing ring, and defining a first end connected with the semiconductor power source and a second end extended into the rectangular wave guide.

In some embodiments, the first end of the probe is connected with a micro-strip line of the semiconductor power source directly or via a coaxial transmission cable.

In some embodiments, the microwave feeding assembly includes an antenna defining a first end connected with the semiconductor power source via a coaxial transmission cable and a second end extended into the chamber body.

In some embodiments, a ceramic plate is disposed in the chamber body and divides an interior of the chamber body into a first chamber and a second chamber, the first end of the antenna is connected with the semiconductor power source, and the second end of the antenna is extended into the second chamber.

BRIEF DESCRIPTION OF THE DRAWINGS

FIG. 7 is a schematic view of a semiconductor microwave oven according to a third embodiment of the present invention; in which:

Figure 1:
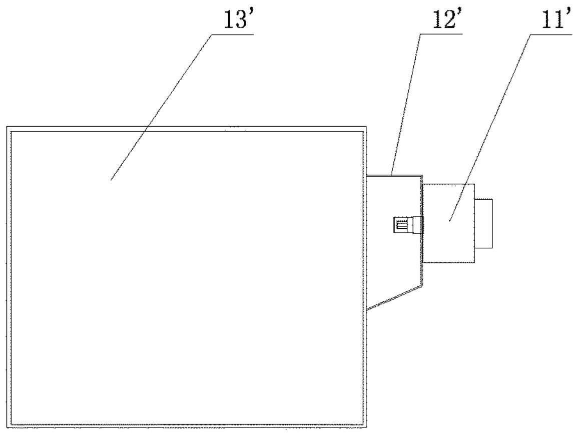
FIG. 1 is schematic view of a microwave oven having a magnetron tube in the related art.

20 direct current power supply;
24 cooling fan;
25 door;
26 chamber body;
27 rectangular wave guide;
30 semiconductor power plate;
31 shield;
33 radiator;
42 semiconductor power source;
45 magnetron output assembly;
46 coaxial transmission line;
51 antenna;
52 first fixing ring;
53 second fixing ring;
54 bottom plate;
55 antenna cap;
56 mounting tube;
57 ceramic ring;
58 tube case;
59 blocking cover;
64 probe;
85 ceramic plate.

DETAILED DESCRIPTION

In the specification, it is to be understood that terms such as “central,” “longitudinal,” “lateral,” “length,” “width,” “thickness,” “upper,” “lower,” “front,” “rear,” “left,” “right,” “vertical,” “horizontal,” “top,” “bottom,” “inner,” “outer,” “clockwise,” and “counterclockwise” should be construed to refer to the orientation as then described or as shown in the drawings under discussion. These relative terms are for convenience of description and do not require that the present invention be constructed or operated in a particular orientation.

In addition, terms such as “first” and “second” are used herein for purposes of description and are not intended to indicate or imply relative importance or significance or to imply the number of indicated technical features. Thus, the feature defined with “first” and “second” may comprise one or more of this feature. In the description of the present invention, “a plurality of” means two or more than two, unless specified otherwise.

In the present invention, unless specified or limited otherwise, the terms “mounted,” “connected,” “coupled,” “fixed” and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than of the second feature.

A microwave feeding structure for a semiconductor microwave oven according to an embodiment of the present invention will be described below with reference to the drawings.

As shown in FIGS. 2-7, the microwave feeding structure for the semiconductor microwave oven according to an embodiment of the present invention includes a chamber body 26, a semiconductor power source 42 and a microwave feeding assembly. The chamber body 26 has a door 25 for opening or closing an opening of the chamber body 26. The semiconductor power source 42 is configured to generate a microwave. The microwave feeding assembly is connected with the semiconductor power source 42 and the chamber body 26, so as to feed the microwave generated by the semiconductor power source 42 into the chamber body 26 and to convert a first microwave mode output by the semiconductor power source 42 into a second microwave mode adaptive to microwave heating, thus heating food in the chamber body 26. A direct current power supply 20 is connected with the semiconductor power source 42 for powering the semiconductor power source 42.

The microwave feeding structure for the semiconductor microwave oven according to embodiments of the present invention may feed the microwave generated by the semiconductor power source 42 into the chamber body 26, that is, a microwave of a mode of TE11 output by the semiconductor power source 42 is converted into a microwave of a mode of TE10 adaptive to microwave heating by means of the microwave feeding assembly. Moreover, since the microwave is generated by the semiconductor power source 42, the microwave oven is high in heating efficiency, simple in structure, low in cost and light in weight, and generates a large power density per unit volume; and the microwave feeding structure is simple in structure, flexible to operate, and wide in application range.

In some particular embodiments, the semiconductor power source 42 includes a semiconductor power plate 30, a shield 31 and a radiator 33. The shield 31 is disposed above the semiconductor power plate 30 for shielding the semiconductor power plate 30. The semiconductor power plate 30 is connected with the microwave feeding assembly. The radiator 33 is attached on a bottom surface of the semiconductor power plate 30 for radiating heat generated by the semiconductor power plate 30. A cooling fan 24 is disposed in the chamber body 26 for radiating heat.

As described above, with the semiconductor power source 42, the microwave generated by the semiconductor power plate 30 is fed into the chamber body 26, and a microwave of a mode of TE11 output by the semiconductor power source 42 is converted into a microwave of a mode of TE10 adaptive to microwave heating by means of the microwave feeding structure, thus achieving the semiconductor microwave heating.

It would be appreciated by those skilled in the art that the semiconductor power plate 30 is provided with an LDMOS (laterally diffused metal oxide semiconductor) transistor, a biasing and control circuit, a power combiner, and a power detection and control circuit. A switching power supply, an accumulator or a charger is disposed between the semiconductor power source 42 and an external alternating current power supply for transforming a voltage. The biasing and control circuit includes a circuit for detecting the output power of the semiconductor power source, a circuit for detecting the reflection power of the semiconductor power source, a turn-off signal circuit of the semiconductor power source, a direct current+input circuit of the semiconductor power source, and a direct current−input circuit of the semiconductor power source. A desired voltage of the semiconductor power source is direct current 0-32 V. The microwave output power of an excitation source may be adjusted by adjusting the input voltage, thus realizing stepless adjustment of the power of a semiconductor microwave oven. This would be appreciated by those skilled in the art, and will not be described in detail here.

The operation principle of the semiconductor power plate 30 is as follows: a certain number of LDMOS transistors with a certain power generate a microwave with a frequency of 2450 MHz±50 MHz via a self-oscillation circuit. The frequency may also be varied by adjusting the variable capacitance of the self-oscillation circuit of the LDMOS transistors. Depending on the standing wave ratio of the chamber body under practical conditions (e.g., the thickness of food, a heating state), a frequency with a minimum standing wave is selected from a range of 2400 MHz to 2500 MHz for heating.

Particular embodiments of the microwave feeding structure for the semiconductor microwave oven according to the present invention will be described below with reference to the drawings.

First Embodiment

Figure 2:
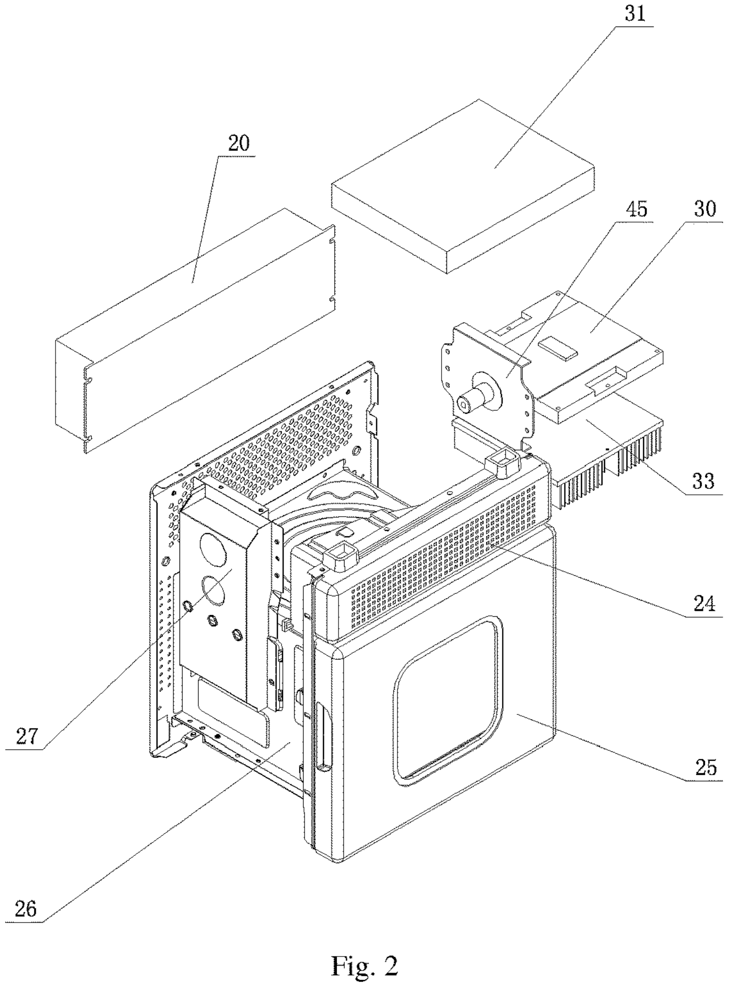
FIG. 2 is a schematic exploded view of a semiconductor microwave oven according to a first embodiment of the present invention.
Figure 3:
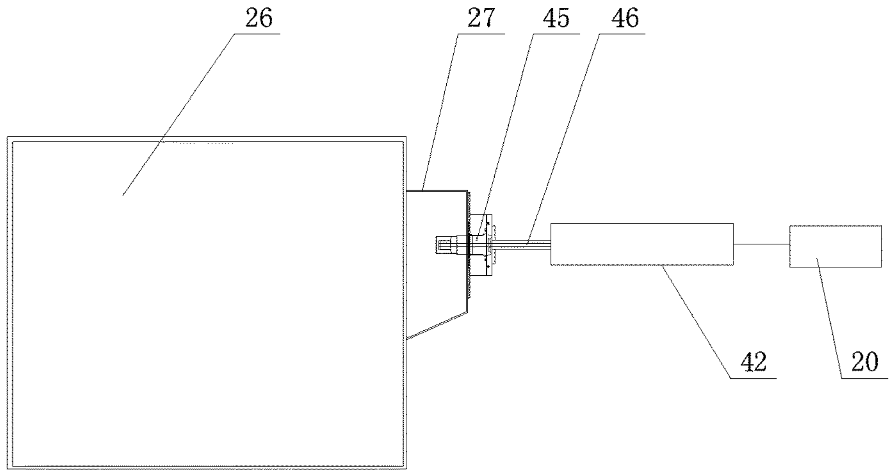
FIG. 3 is a schematic side view of the semiconductor microwave oven according to the first embodiment of the present invention.
Figure 4:
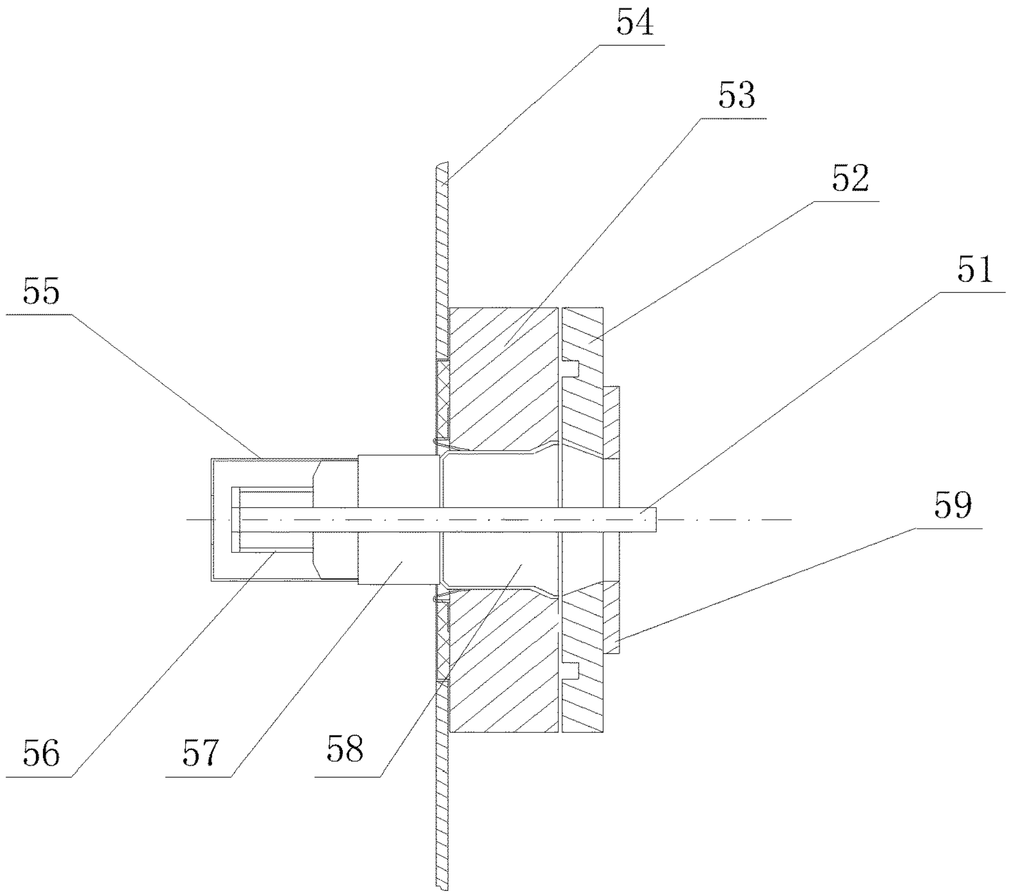
FIG. 4 is a schematic partial view of a microwave feeding assembly of the semiconductor microwave oven according to the first embodiment of the present invention, in which the microwave feeding assembly is similar to a magnetron output assembly of a microwave oven in the related art.

Referring to FIGS. 2-4, the microwave feeding structure for the semiconductor microwave oven according to the first embodiment of the present invention includes a chamber body 26 having a door 25, a semiconductor power source 42, a rectangular wave guide 27 and a microwave feeding assembly 45. The rectangular wave guide 27 is mounted on the chamber body 26, and a semiconductor power plate 30 of the semiconductor power source 42 may be connected with the microwave feeding assembly 45 directly or via a coaxial transmission cable 46. If the semiconductor power plate 30 of the semiconductor power source 42 is connected with the microwave feeding assembly 45 via the coaxial transmission cable 46, an N-type connector is mounted on the semiconductor power plate 30 for converting a microstrip output into a coaxial output, and the coaxial transmission cable 46 is connected with the semiconductor power plate 30 via the N-type connector.

A radiator 33 is closely attached to a bottom surface of the semiconductor power plate 30, a shield 21 is located between the semiconductor power plate 30 and a shell of the semiconductor microwave oven, and the microwave feeding assembly 45 is connected with the rectangular wave guide 27, such that the microwave generated by the semiconductor power source 42 is fed into the chamber body 26 via the microwave feeding assembly 45 and the rectangular wave guide 27.

In this embodiment, the microwave feeding assembly 45 is similar to a magnetron output assembly of a microwave oven having a magnetron tube in the related art, such that the microwave oven having the magnetron tube in the related art may be conveniently modified. Specifically, the magnetron tube of the microwave oven in the related art is replaced with the semiconductor power source 42, and the magnetron output assembly is appropriately modified so as to obtain the semiconductor microwave oven, without making other modifications on the microwave oven in the related art, thus reducing the cost.

As shown in FIG. 4, in this embodiment, the microwave feeding assembly 45 includes a mounting tube 56, a ceramic ring 57, a tube case 58 and an antenna 51. An end of the ceramic ring 57 is connected with the mounting tube 56, and the tube case 58 is connected with the other end of the ceramic ring 57. A first end (i.e. a right end in FIG. 4) of the antenna 51 is connected with the semiconductor power source 42, and a second end (i.e. a left end in FIG. 4) of the antenna 51 is extended through the tube case 58, the ceramic ring 57 and the mounting tube 56 sequentially into the rectangular wave guide 27. The antenna 51 converts a microwave of a mode of TE11 output by the semiconductor power plate 30 into a microwave of a mode of TE10 adaptive to microwave heating, and feeds the microwave of a mode of TE10 into the chamber body 26.

In one example, as shown in FIG. 4, an antenna cap 55 is fitted over an end (i.e. a left end in FIG. 4) of the mounting tube 56 adjacent to the rectangular wave guide 27, and the microwave feeding assembly 45 further includes a bottom plate 54, a first fixing ring 52 and a second fixing ring 53. The bottom plate 54 is mounted on the rectangular wave guide 27, the ceramic ring 57 is mounted on one side (i.e. a left side in FIG. 4) of the bottom plate 54, and the tube case 58 is mounted on the other side (i.e. a right side in FIG. 4) of the bottom plate 54. The first fixing ring 52 is mounted on the semiconductor power source 42, and the second fixing ring 53 is fitted over the tube case 58 and connected with the bottom plate 54 and the first fixing ring 52.

Particularly, the first fixing ring 52 and the second fixing ring 53 may be fixed together via a bolt. Specifically, the bolt passes through a through hole in the second fixing ring 53, and is screwed into a threaded hole in the first fixing ring 52, so as to achieve the connection between the first fixing ring 52 and the second fixing ring 53.

As shown in FIG. 4, a filler such as polytetrafluoroethylene may be filled in a space where the antenna 51 passes through. A blocking cover 59 is disposed on a right side of the first fixing ring 52 for stopping the first fixing ring 52 and the filler.

With the microwave feeding structure according to the first embodiment of the present invention, the antenna 51 converts the microwave of a mode of TE11 output by the semiconductor power plate 30 into the microwave of a mode of TE10 adaptive to microwave heating, and feeds the microwave of a mode of TE10 into the chamber body 26 via the rectangular wave guide 27, such that the microwave feeding structure is simple in structure and low in cost. Therefore, the microwave oven having the magnetron tube in the related art may be modified so as to obtain the semiconductor microwave oven, without making modifications on other structures of the microwave oven in the related art, thus reducing the cost.

Second Embodiment

Figure 5:
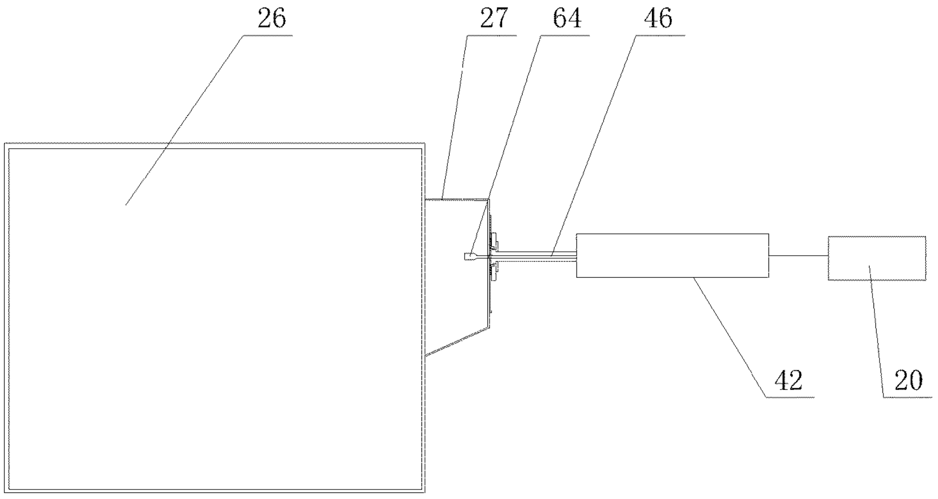
FIG. 5 is a schematic side view of a semiconductor microwave oven according to a second embodiment of the present invention.
Figure 6:
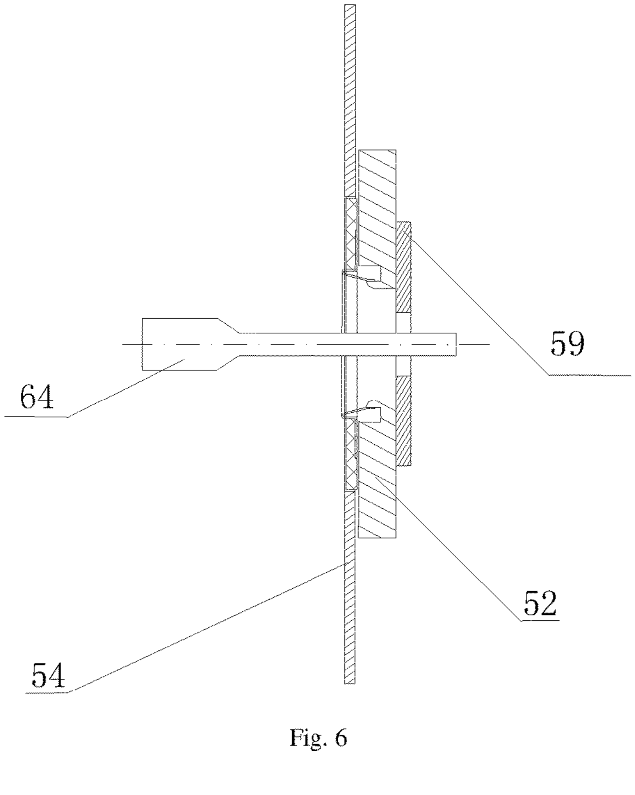
FIG. 6 is a schematic partial view of a microwave feeding assembly of the semiconductor microwave oven according to the second embodiment of the present invention.

Referring to FIGS. 5-6, in the second embodiment of the present invention, the microwave feeding assembly includes a bottom plate 54, a first fixing ring 52 and a probe 64. The bottom plate 54 is mounted on the rectangular wave guide 27. The first fixing ring 52 is connected between the bottom plate 54 and the semiconductor power source 42. The probe 64 passes through the bottom plate 54 and the first fixing ring 52 sequentially, a first end (i.e. a right end in FIG. 6) of the probe 64 is connected with the semiconductor power source 42, and a second end (i.e. a left end in FIG. 6) of the probe 64 is connected with the rectangular wave guide 27. The probe 64 converts a microwave of a mode of TE11 output by a semiconductor power plate 30 into a microwave of a mode of TE10 adaptive to microwave heating, and feeds the microwave of a mode of TE10 into the chamber body 26.

Alternatively, the first end of the probe 64 may be connected with a micro-strip line of the semiconductor power source 42 directly or via a coaxial transmission cable 46. If the first end of the probe 64 is connected with the micro-strip line of the semiconductor power source 42 via the coaxial transmission cable 46, an N-type connector is mounted on the semiconductor power plate 30 for converting a micro-strip output into a coaxial output, and the coaxial transmission cable 46 is connected with the semiconductor power plate 30 via the N-type connector.

As shown in FIG. 6, polytetrafluoroethylene may also be filled in a space of the bottom plate 54 and the first fixing ring 52 where the antenna 51 passes through, and the space is blocked by a blocking cover 59.

Other structures and operation of the microwave feeding structure according to the second embodiment of the present invention may be the same as those according to the first embodiment of the present invention, and will not be repeatedly described here.

The microwave feeding structure according to the second embodiment of the present invention is more simple in structure and lower in cost, and may feed the microwave generated by the semiconductor power source into the chamber body effectively.

Third Embodiment

Figure 7:
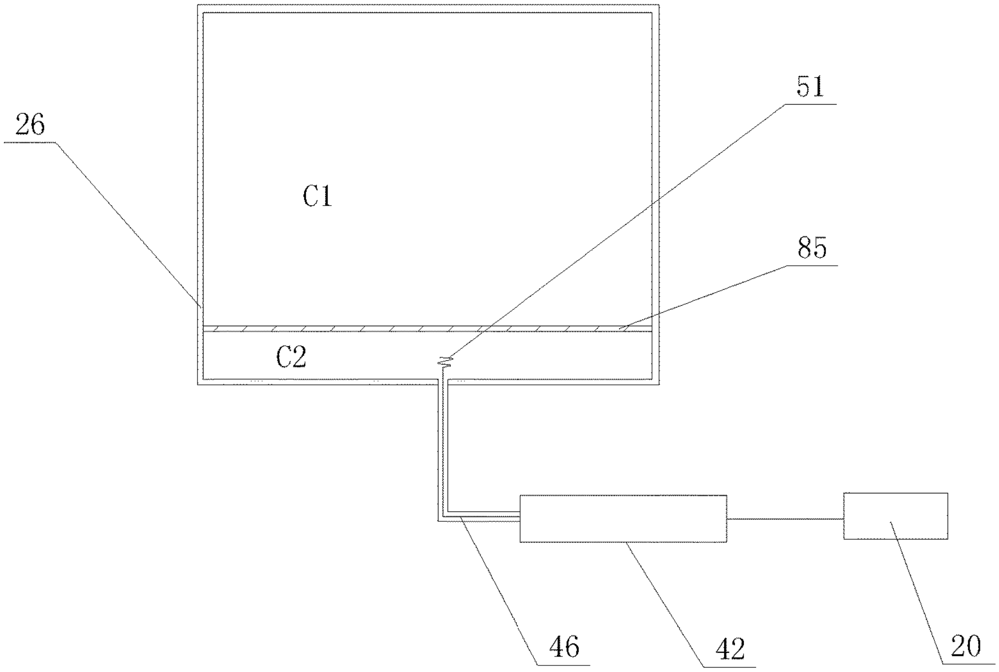

Referring to FIG. 7, in the third embodiment of the present invention, the microwave feeding assembly of the microwave feeding structure includes an antenna 51. A first end (i.e. a right end in FIG. 7) of the antenna 51 is connected with the semiconductor power source 42, and a second end (i.e. a left end in FIG. 7) of the antenna 51 is extended into the chamber body 26. Therefore, the antenna 51 may conveniently convert a microwave of a mode of TE11 output by a semiconductor power plate 30 into a microwave of a mode of TE10 adaptive to microwave heating, and feed the microwave of a mode of TE10 into the chamber body 26.

In some embodiments, a ceramic plate 85 is disposed in the chamber body 26 and divides an interior of the chamber body 26 into a first chamber C1 and a second chamber C2, the second end of the antenna 51 is extended into the second chamber C2, and the first chamber C1 is used to accommodate food, thus avoiding the contamination of the antenna 51 resulting from the cooking of food.

Alternatively, the antenna 51 may be connected with the semiconductor power plate 30 via a coaxial transmission cable 46.

Other structures and operation of the microwave feeding structure according to the third embodiment of the present invention may be the same as those according to the first and second embodiments of the present invention, and will not be described in detail here.

The microwave feeding structure according to the third embodiment of the present invention is more simple in structure and lower in cost The semiconductor microwave oven according to an embodiment of the present invention will be described below. The semiconductor microwave oven according to an embodiment of the present invention includes a chamber body 26, a semiconductor power source 42, a microwave feeding assembly and a power supply. The chamber body 26 has a door 25 for opening or closing an opening of the chamber body 26. The semiconductor power source 42 is configured to generate a microwave. The microwave feeding assembly is connected between the semiconductor power source 42 and the chamber body 26, so as to convert the microwave of a mode of TE11 output by the semiconductor power source 42 into a microwave of a mode of TE10 adaptive to microwave heating and to feed the microwave of a mode of TE10 into the chamber body 26, thus heating food in the chamber body 26. The power supply such as a direct current power supply 20 is connected with the semiconductor power source 42 for powering the semiconductor power source 42.

The microwave feeding assembly of the semiconductor microwave oven according to an embodiment of the present invention may be the microwave feeding assembly described with reference to any one of the above embodiments, and other structures and operation of the semiconductor microwave oven is known to those skilled in the art and will not be described in detail here.

With the semiconductor microwave oven according to embodiments of the present invention, the microwave generated by the semiconductor power source 42 may be fed into the chamber body 26 by means of the microwave feeding assembly, the microwave feeding structure is simple in structure and low in cost, and the semiconductor microwave oven is high in efficiency, simple in structure, low in cost and light in weight, and generates a large power density per unit volume.

Reference throughout this specification to "an embodiment," "some embodiments," "one embodiment," "another example," "an example," "a specific example," or "some examples," means that a particular feature, structure, material, or characteristic described in connection with the embodiment or example is included in at least one embodiment or example of the present invention. Thus, the appearances of the phrases such as "in some embodiments," "in one embodiment," "in an embodiment," "in another example," "in an example," "in a specific example," or "in some examples," in various places throughout this specification are not necessarily referring to the same embodiment or example of the present invention. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present invention, and changes, alternatives, and modifications can be made in the embodiments without departing from spirit, principles and scope of the present invention.

What is claimed is:

1. A microwave feeding structure for a semiconductor microwave oven, comprising:
- a chamber body having a door;
- a semiconductor power source configured to generate a microwave; and
- a microwave feeding assembly connected between the semiconductor power source and the chamber body, and configured to feed the microwave generated by the semiconductor power source into the chamber body and to convert a first microwave mode of TE11 output by the semiconductor power source into a second microwave mode of TE10 adaptive to microwave heating, and
- a rectangular wave guide connected with the chamber body,
- wherein the microwave feeding assembly is connected between the semiconductor power source and the rectangular wave guide, and includes;
  - a mounting tube;
  - a ceramic ring having a first end connected with the mounting tube and a second end;
  - a tube case connected with the second end of the ceramic ring; and
  - an antenna defining a first end connected with the semiconductor power source and a second end extended through the tube case, the ceramic ring and the mounting tube sequentially into the rectangular wave guide.

2. The microwave feeding structure according to claim 1, wherein the semiconductor power source comprises:
- a semiconductor power plate connected with the microwave feeding assembly;
- a shield disposed above the semiconductor power plate; and
- a radiator attached on a bottom surface of the semiconductor power plate.

3. The microwave feeding structure according to claim 1, wherein an antenna cap is fitted over an end of the mounting tube adjacent to the rectangular wave guide, and
- wherein the microwave feeding assembly further comprises:
- a bottom plate mounted on the rectangular wave guide, the ceramic ring being mounted on one side of the bottom plate, and the tube case being mounted on the other side of the bottom plate;
- a first fixing ring mounted on the semiconductor power source;
- a second fixing ring fitted over the tube case and connected with the bottom plate and the first fixing ring, and
- a filler in a space where the antenna passes through, and a blocking cover disposed on a right side of the first fixing ring for stopping the first fixing ring and the filler.

4. A microwave feeding structure for a semiconductor microwave oven, comprising:
- a chamber body having a door;
- a semiconductor power source configured to generate a microwave;
- a microwave feeding assembly connected between the semiconductor power source and the chamber body, and configured to feed the microwave generated by the semiconductor power source into the chamber body and to convert a first microwave mode of TE11 output by the semiconductor power source into a second microwave mode of TE10 adaptive to microwave heating; and, a rectangular wave guide connected with the chamber body, wherein the microwave feeding assembly is connected between the semiconductor power source and the rectangular wave guide, and includes;

a bottom plate mounted on the rectangular wave guide;

a first fixing ring connected between the bottom plate and the semiconductor power source; and a probe passing through the bottom plate and the first fixing ring, and defining a first end connected with the semiconductor power source and a second end extended into the rectangular wave guide.

5. The microwave feeding structure according to claim 4, wherein the semiconductor power source comprises:

a semiconductor power plate connected with the microwave feeding assembly;

a shield disposed above the semiconductor power plate; and a radiator attached on a bottom surface of the semiconductor power plate.

6. The microwave feeding structure according to claim 4, wherein the first end of the probe is connected with a micro-strip line of the semiconductor power source directly or via a coaxial transmission cable, wherein the microwave feeding assembly further comprises a filler in a space between the bottom plate and the first fixing ring where the antenna passes through, and a blocking cover for blocking the filler.

7. A microwave feeding structure for a semiconductor microwave oven, comprising:

a chamber body having a door;

a semiconductor power source configured to generate a microwave; and a microwave feeding assembly connected between the semiconductor power source and the chamber body, and configured to feed the microwave generated by the semiconductor power source into the chamber body and to convert a first microwave mode of TE11 output by the semiconductor power source into a second microwave mode of TE10 adaptive to microwave heating, wherein the microwave feeding assembly comprises an antenna defining a first end connected with the semiconductor power source via a coaxial transmission cable and a second end extended into the chamber body.

8. The microwave feeding structure according to claim 7, wherein the semiconductor power source comprises:

a semiconductor power plate connected with the microwave feeding assembly;

a shield disposed above the semiconductor power plate; and a radiator attached on a bottom surface of the semiconductor power plate.

9. The microwave feeding structure according to claim 7, wherein a ceramic plate is disposed in the chamber body and divides an interior of the chamber body into a first chamber and a second chamber, the second end of the antenna being extended into the second chamber.

* * * * *